(12) United States Patent
Su et al.

(10) Patent No.: US 9,412,905 B2
(45) Date of Patent: Aug. 9, 2016

(54) WHITE LIGHT EMITTING DEVICE

(75) Inventors: Kai Su, Midland, MI (US); Zhaorong Weng, Hangzhou (CN); Wengang Bi, Fremont, CA (US); David Battaglia, Fayetteville, AR (US); Haoguo Zhu, Fayetteville, AR (US)

(73) Assignee: Najing Technology Corporation Limited, Hangzhou, Zhejiang (CN)

( * ) Notice: Subject to any disclaimer, the term of this patent is extended or adjusted under 35 U.S.C. 154(b) by 62 days.

(21) Appl. No.: 14/008,564

(22) PCT Filed: Mar. 30, 2012

(86) PCT No.: PCT/US2012/031655
§ 371 (c)(1),
(2), (4) Date: Sep. 29, 2013

(87) PCT Pub. No.: WO2012/135744
PCT Pub. Date: Oct. 4, 2012

(65) Prior Publication Data
US 2014/0022779 A1    Jan. 23, 2014

Related U.S. Application Data

(60) Provisional application No. 61/516,296, filed on Apr. 1, 2011.

(51) Int. Cl.
*F21V 9/16* (2006.01)
*H01L 33/26* (2010.01)
(Continued)

(52) U.S. Cl.
CPC .............. *H01L 33/26* (2013.01); *C09K 11/02* (2013.01); *C09K 11/565* (2013.01); *C09K 11/883* (2013.01); *F21K 9/56* (2013.01); *F21V 9/16* (2013.01); *H01L 33/504* (2013.01);
(Continued)

(58) Field of Classification Search
CPC ......................................................... F21V 9/16
USPC ........................................ 362/84; 252/519.4
See application file for complete search history.

(56) References Cited

U.S. PATENT DOCUMENTS 6,501,091 B1    12/2002    Bawendi
6,803,719 B1    10/2004    Miller
(Continued)

FOREIGN PATENT DOCUMENTS

WO    WO2004/066361 A2    8/2004
WO    WO2009/014707 A2    1/2009

OTHER PUBLICATIONS

Manna et al., "Epitaxial Growth and Photochemical Annealing of Graded CdS/ZnS Shells on Colloidal CdSe Nanorods", J. Am.Chem. Soc., vol. 124, No. 24, 7136-7145 (2002).
(Continued)

*Primary Examiner* — Anh Mai
*Assistant Examiner* — Matthew Peerce
(74) *Attorney, Agent, or Firm* — Lynne M. Blank, Esq.

(57) ABSTRACT

The present invention relates to a light-emitting device including a light source, a first light-emitting material spaced apart from the light source, and at least one additional light-emitting material. The first light-emitting material includes low reabsorbing semiconductor nanocrystals having an emission-center core, an exterior protective shell, and at least one inner light-absorbing shell. The device is useful for efficiently producing white light having a high color rendering index.

34 Claims, 6 Drawing Sheets

(51) Int. Cl.
*H01L 33/50* (2010.01)
*C09K 11/02* (2006.01)
*C09K 11/56* (2006.01)
*C09K 11/88* (2006.01)
*F21K 99/00* (2016.01)
*H01L 25/075* (2006.01)
*F21Y 101/02* (2006.01)

(52) U.S. Cl.
CPC ......... *F21Y2101/02* (2013.01); *H01L 25/0753* (2013.01); *H01L 33/507* (2013.01); *H01L 2924/0002* (2013.01); *Y02B 20/181* (2013.01)

(56) References Cited

U.S. PATENT DOCUMENTS

| | | | | |
|---|---|---|---|---|
| 7,750,359 | B2* | 7/2010 | Narendran et al. | 257/98 |
| 7,759,689 | B2* | 7/2010 | Bour | 257/96 |
| 7,819,539 | B2* | 10/2010 | Kim et al. | 362/84 |
| 2005/0135079 | A1 | 6/2005 | Yin Chu | |
| 2007/0194279 | A1 | 8/2007 | Peng | |
| 2007/0246734 | A1 | 10/2007 | Lee | |
| 2008/0012031 | A1* | 1/2008 | Jang et al. | 257/89 |
| 2008/0173845 | A1 | 7/2008 | Ryowa | |
| 2009/0147497 | A1* | 6/2009 | Nada | 362/84 |
| 2009/0231832 | A1* | 9/2009 | Zukauskas et al. | 362/84 |
| 2010/0053930 | A1* | 3/2010 | Kim et al. | 362/84 |
| 2010/0157572 | A1* | 6/2010 | Wei et al. | 362/84 |
| 2010/0232134 | A1* | 9/2010 | Tran | 362/84 |
| 2010/0259917 | A1* | 10/2010 | Ramer et al. | 362/84 |
| 2010/0289044 | A1 | 11/2010 | Krames | |
| 2010/0316797 | A1 | 12/2010 | Ying | |
| 2012/0230010 | A1* | 9/2012 | Kato et al. | 362/84 |
| 2012/0300432 | A1* | 11/2012 | Matsubayashi et al. | 362/84 |
| 2013/0050978 | A1* | 2/2013 | Suzuki et al. | 362/84 |
| 2013/0258637 | A1* | 10/2013 | Wang et al. | 362/84 |
| 2014/0055979 | A1* | 2/2014 | Suzuki et al. | 362/84 |
| 2014/0307417 | A1* | 10/2014 | Yamakawa et al. | 362/84 |
| 2014/0328048 | A1* | 11/2014 | Streppel et al. | 362/84 |

OTHER PUBLICATIONS

Xie et al., "Synthesis and Characterization of Highly Luminescent CdSe-Core CdS/Zn0.5Cd0.5S/ZnS Multishell Nanocrystals", J.Am. Chem.Soc., vol. 127, No. 20, 7480-7488 (2005).

Chen et al., "'Giant Multishell CdSe Nanocrystal Quantum Dots with Suppressed Blinking", J.Am.Chem.Soc., vol. 130, No. 15, 5026-5027 (2008).

Stoudam et al., "Red, Green, and Blue Quantum Dot LEDs with Solution Processable ZnO Nanocrystal Electron Injection Layers".

Anikeeva et al., "Quantum-Dot Light Emitting Devices with Electroluminescence Tunable Over the Entire Visible Spectrum".

* cited by examiner

WHITE LIGHT EMITTING DEVICE

FIELD OF THE INVENTION

The present invention relates to a device that emits white light and includes a light source; a light-emitting material including optimized semiconductor nanocrystals having, simultaneously, an emission core surrounded by at least one inner light-absorbing shell, and a protective exterior shell; and at least one additional light-emitting material.

BACKGROUND OF THE INVENTION

Semiconductor technology is a basis for much of the modern electronic era including light sources such as light-emitting diodes (LED's). Semiconductor nanocrystals, often referred to as quantum dots, were discovered in the 1980's and have unique properties. Semiconductor nanocrystals are nanometer-sized fragments of the corresponding bulk crystals, and have properties between those of bulk crystals and molecules; they have generated fundamental interest for their promise in developing advanced optical materials. The size-dependent emission is probably the most attractive property of conventional semiconductor nanocrystals. For example, differently sized CdSe nanocrystals can be prepared that emit from blue to red light, with comparatively pure color emissions. These nanocrystal-based emitters can be used for many purposes, such as for solid-state-lighting, solar cells through frequency down conversion, lasers, biomedical tags, and the like.

For any application of semiconductor nanocrystals as emitters, a high photoluminescence (PL) quantum yield (QY) is a basic and well accepted requirement. However, previous work has not recognized that the absorption of the nanocrystals is as important as their quantum yield. In most practical applications, the absorption of the nanocrystals preferably is as high as possible at the excitation wavelength, but as low as possible at the emission wavelengths. Thus, the wavelength of the main absorption band preferably overlaps as little as possible with the wavelength of the emission band; ideally the main absorption band and emission band do not significantly overlap. To obtain semiconductor nanocrystals with both desired emission properties and absorption properties is a challenge. There is a need for nanocrystals with absorption as high as possible at the excitation wavelength and as low as possible at the emission wavelengths.

Types of semiconductor nanocrystals may be classified into plain core nanocrystals and nanocrystalline cores coated with at least one layer of another semiconductor material, commonly referred to as core/shell nanocrystals. The shell layer(s) usually differs from the nanocrystalline core material. Core/shell nanocrystals are likely to be the desired structures when the nanocrystals either undergo complicated chemical treatments, such as in bio-medical applications, or when the nanocrystals are constantly excited, such as diodes and lasers. Core/shell nanocrystals are representative of a number of different complex structured nanocrystals, such as core/shell/shell structured materials, the architectures of which are aimed at providing fine control over the nanocrystal's photophysical properties.

Core/shell semiconductor nanocrystals, in which the core composition differs from the composition of the shell that surrounds the core, are useful for many optical applications. If the band offsets of the core/shell structures are type-I, and the shell semiconductor possesses a higher bandgap than the core material does, then the photo-generated electron and hole inside a nanocrystal will be mostly confined within the core.

As used herein, type-I band offsets refers to a core/shell electronic structure wherein the energy level of the conduction band is higher for each consecutive shell compared to the core or to a shell that is closer to the core. The energy level of the valence band is lower for each consecutive shell compared to the core or to a shell that is closer to the core. Conventional core/shell nanocrystals can show high photoluminescence (PL) and electroluminescence efficiencies and can be more stable against photo-oxidation than "plain core" semiconductor nanocrystals comprising a single material, provided that the bandgap of the core semiconductor is smaller than that of the shell semiconductor.

Shells of graded composition, which are multiple monolayers in thickness, are known. See, for example, Liberato Manna, Erik C. Scher, Liang-Shi Li, and A. Paul Alivasatos, "*Epitaxial Growth and Photochemical Annealing of Graded CdS/ZnS Shells on Colloidal CdSe Nanorods*", J. Am. Chem. Soc., Vol. 124, No. 24, 7136-7145 (2002) (referred to herein as "Alivasatos"); Renguo Xie, Ute Kolb, Jixue Li, Thomas Basche, and Alf Mews, "*Synthesis and Characterization of Highly Luminescent CdSe-Core CdS/Zn 0.5Cd0.5S/ZnS Multishell Nanocrystals*", J. Am. Chem. Soc., Vol. 127, No. 20, 7480-7488 (2005) (referred to herein as "Mews"), both incorporated herein by reference in their entirety. A graded shell composition is useful because the core and shell semiconductors generally have different lattice constants, which can cause significant lattice mismatch. Although graded shell compositions are known, all graded systems are designed with the core as the central concern. The entire shell—including the graded part—is considered as a "protection layer" to boost the emission properties of the nanocrystals. See, for example, WO 2009/014707 to Kazlas, pg. 36. Such a protection layer is thought to prevent the photo-generated charges from being exposed onto the surface of the nanocrystals. The protection layer preferably increases the photoluminescence (PL) quantum yield (QY) by offering a higher chance for the charges to recombine within the core of the nanocrystals and enhance the photostability by eliminating photochemical reactions on the surface of the nanocrystals. Papers published by the Alivisatos group and the Mews group could be considered as typical examples of such core/graded shell/shell nanocrystals.

The "Alivisatos" paper discusses growth of ZnS shell(s) onto CdSe nanorods with CdS as the graded shell between the core and outer ZnS shell to improve the photoluminescence (PL) quantum yield (QY). The photoluminescence (PL) quantum yield (QY) of the resulting CdSe/CdS/ZnS core/shell/shell nanorods is about 10-20%, which is not very high but is significantly improved in comparison to the core nanorods. The "Mews" paper, using a new growth technique (successive-layer-adsorption-and-reaction, SILAR, as described in WO 2004/066361 and U.S. Pat. Pub. No. 2007/0194279, both incorporated herein by reference in their entirety), discloses the growth of $CdSe/CdS/Cd_{0.5}Zn_{0.5}S/ZnS$ core/shell/shell/shell nanocrystals to minimize the lattice mismatch between the CdSe core and the ZnS outer shell, about 12%. The photoluminescence (PL) quantum yield (QY) in "Mews" is as high as 70-85%, but the authors do not focus on optimizing the absorption properties. In other words, the middle CdS and $Cd_{0.5}Zn_{0.5}S$ are introduced as pure "lattice matching" layers. A nanocrystal (CdSe/thick CdS/ZnS core/shell/shell) synthesized by using SILAR, as disclosed in Yongfen Chen, Javier Vela, Han Htoon, Joanna L. Casson, Donald J. Werder, David A. Bussian, Victor I. Klimov, and Jennifer A. Hollingsworth, "'*Giant' Multishell CdSe Nanocrystal Quantum Dots with Suppressed Blinking*", J. Am. Chem. Soc., Vol. 130, No. 15, 5026-5027 (2008) (referred to herein as "Chen"), incorporated herein by reference, has quite poor emission properties, but the thick CdS shell offers excellent absorption properties.

There has been much effort directed at using LED's to provide solid state lighting (SSL) devices and to replace traditional light, such as incandescent, fluorescent and halogen lighting, in order to improve energy efficient and increase product lifetimes. However, conventional LED's are restricted in the possible colors they can produce and can have manufacturing and quality control issues.

One approach has been to combine LED technology and with conventional phosphors, which partially absorb the LED light and re-emit light having a longer wavelength. For example, one method of producing white light uses a blue LED wherein a portion of the blue light is used to excite a yellow phosphor, the resulting emission is a combination of blue and yellow light, and thus, white light is produced. However, this approach is also limited in that the type of white light is not readily adjusted; for example, depending on the application, a 'cold' white or a 'warm' white may be desired and can be difficult to produce using this technology. In order to achieve "warm" white, one could further add red phosphors in the form of mixed phosphors. However, red phosphors show significant absorption of green and yellow emission, which greatly reduce the lumen output of a white LED and related lighting devices.

Incorporation of quantum dot technology into SSL applications has also recently received considerable attention. For example, U.S. Pat. No. 6,501,091 to Bawendi et al., incorporated herein by reference in its entirety, describes producing white light by using an LED source that emits blue light. The blue light passes through a matrix containing quantum dots, which absorb a portion of the blue light and emit green light, the remaining blue light and the green light pass through a matrix containing quantum dots that emit red light, when the light exits this layer it contains the remaining blue light, green light, and red light, and the combination will appear white.

U.S. Pat. No. 6,803,719 to Miller et al., incorporated herein by reference in its entirety, describes a white light-emitting device similar to Bawendi et al., having an LED that emits blue light and a layer containing quantum dots that emit red light formed on the blue LED, followed by a layer containing green light emitting quantum dots. White light can be produced by combining the blue, green, and red light emissions.

The combination of LED chips, phosphors, and nanocrystals has also been explored. For example, U.S. Pat. Pub. No. 2007/0246734 by Lee et al., incorporated herein by reference in its entirety, describes a device for producing white light that includes a green phosphor and a blue phosphor formed on a UV light emitting diode, and wherein a red quantum dot layer is formed on the layer of mixed phosphors.

U.S. Pat. Pub. No. 2005/0135079 by Yin Chu et al., incorporated herein by reference in its entirety, describes the use of nanocrystals and phosphors in the same layer of a white light-emitting device.

U.S. Pat. Pub. No. 2008/0012031 by Jang et al., incorporated herein by reference in its entirety, describes white light-emitting device in which an emission layer includes a combination of a blue LED and a layer having a red luminous body and a layer having a green luminous body. The red and green luminous bodies can be phosphors or quantum dots.

U.S. Pat. No. 7,750,359 to Narendran et al., incorporated herein by reference in its entirety, describes a solid state light emitting device that generates short wavelength light; and quantum dot material and phosphor material that are each irradiated by some of the short wavelength light and wherein emitted light can reportedly have a chromaticity value near the blackbody locus and a color rendering index greater than 80.

However, none of these prior art references disclose a light-emitting material including semiconductor nanocrystals with optimized absorption, emission, and reabsorption properties and having, simultaneously, an emission core surrounded by at least one inner light-absorbing shell, and a protective exterior shell.

Problem to be Solved

Despite the recent advances in solid state lighting technology, there remains a need for new light-emitting devices that can provide white light with high efficiency, improved stability, and excellent color characteristics.

SUMMARY OF THE INVENTION

The present invention relates to a light-emitting device including: a light source that emits a first light in a first wavelength range; a first light-emitting material comprising low reabsorbing semiconductor nanocrystals optically coupled to receive at least a portion of the first light from the light source and emit a second light having an emission maximum in a second wavelength range; and at least a second light-emitting material optically coupled to receive at least a portion of the first light from the light source, and emit a third light having an emission maximum in a third wavelength range. In one embodiment of the invention, the first, second, and third lights are combined to product white light having a high color rendering index. The present invention also relates to a method of producing white light.

The present invention also relates to a device including low reabsorbing semiconductor nanocrystals and also including one or more phosphor materials or one or more types of conventional quantum dots or combinations thereof. The present invention further relates to an optical element comprising a substrate and including low reabsorbing semiconductor nanocrystals.

Advantageous Effect of the Invention

The present invention includes several advantages, not all of which are incorporated in a single embodiment. The main advantage of the disclosed design in terms of function is that the optimized semiconductor nanocrystals minimize undesired quenching through reduced reabsorption energy transfer. This advantage is significantly enhanced when at least a second light-emitting material is present, and is crucial for any application when a high concentration of light-emitting nanomaterials, a close proximity between nanomaterials, and/or a long optical path length is needed.

In comparison to other down-conversion luminescence materials, including rare earth based phosphors and conventional quantum dots, the semiconductor nanocrystals according to the present invention possess several unique and outstanding advantages, especially when combined with additional light-emitting materials. They offer advantages for solid state lighting, abbreviated herein as SSL, applications, such as high photoluminescence (PL) quantum yield (QY often greater than 85%), continuously tunable emission peak position, very good thermal stability in both color and intensity, high absorption cross-section, zero scattering, and zero self-quenching. These properties of the semiconductor nanocrystals when combined with at least one second light-emitting material enable a light-emitting device that provides efficient production of white light having a high color rendering index, superior lighting performance, greater product design flexibility, simplified manufacturing operations and substantially reduced manufacturing costs.

DETAILED DESCRIPTION OF THE INVENTION

Figure 1:
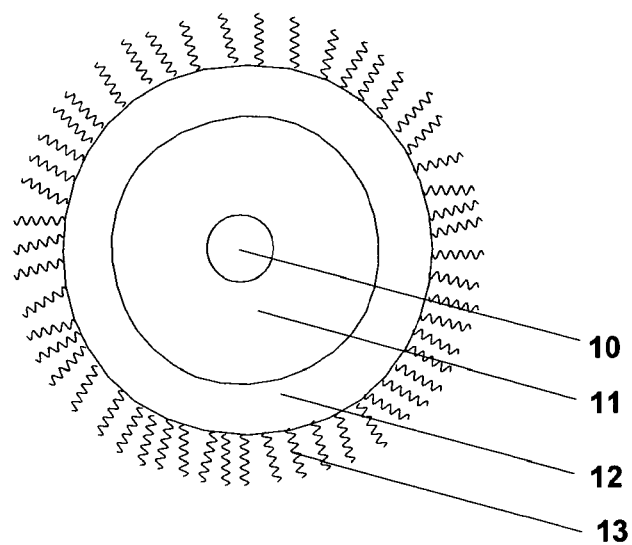
FIG. 1 represents the schematic diagram of the LR quantum dot structure, including emission zone (core), absorption zone (inner light-absorbing shell) and protection zone (outer shell).

The invention provides a light-emitting device including a light source having an emission maximum in the range of about 300 nm to about 500 nm; thus, for example, the light source can emit UV light or blue light.

The light source can include a single component or multiple components that generate light. For example, the light source can be a single LED or multiple LED chips. In one desirable embodiment, the light source emits blue light and has a maximum emission in the range from about 400 nm to about 500 nm and preferably in the range of about 430 nm to about 490 nm, and most preferably 430 to 470. In a preferred embodiment, the light source includes at least one light-emitting diode (LED). LED chips are well-known in the art, and are often made by depositing layers of semiconductor material on a substrate wafer using an epitaxial method, such as metal-organic chemical vapor deposition or MOCVD. The various layers are doped to form p-type and n-type materials that result in the creation of an electric field at their interface (p-n junction). When a sufficient voltage is applied across a p-n junction, current flow is initiated and sustained by the recombination of holes and electrons. Upon recombination, energy approximately equal to the bandgap energy of the junction is released. For III-V semiconductor materials such as GaAs, InP, GaN etc., the released energy is in the form of light. The InGaN—GaN system is often employed for wavelengths from ~365 (ultra-violet, UV) to 550 (yellow-green) nm.

In one embodiment, the light source includes multiple LED chips prepared using "Chip-on-Board", or COB technology, sometimes called 'direct chip attachment', or DCA. This refers to semiconductor assembly technology wherein the LED chips are directly mounted on and electrically interconnected to their final circuit board, instead of undergoing traditional assembly or packaging as individual integrated circuits. The COB process often consists of three major steps: die attach or die mount; wirebonding; and encapsulation of the die and wires.

In one embodiment, a first light-emitting material is present and positioned to receive at least a portion of the light emitted by the light source, for example, blue light, and absorb a portion of that light, and emit a second light having a lower energy (longer wavelength) and having an emission maximum in a second wavelength range, for example, in the range of 500 nm to 600 nm. In certain embodiments, a second light emitting material is present to absorb a portion of the light emitted by the light source and emits a third light having wavelength ranging from about 600 nm to about 700 nm, and desirably from about 600 nm to about 640 nm.

In one suitable embodiment, the first light-emitting material is spaced apart from the light source, that is, the first light-emitting material is not contiguous to the light source. In some cases this can improve the stability of the device since light sources often generate heat during operation and some light-emitting materials may be susceptible to drop in quantum efficiency or thermal degradation. In one preferred embodiment, the first light-emitting material is separated from the light source such that the average temperature at the location of the first light-emitting material during operation of the lighting-emitting device is less than 120° C., or less than 85° C., or even less than 70° C. or lower. Desirably the separation distance is sufficient so that the temperature at the location of the first light-emitting material during operation of the lighting-emitting device is in a range of from about 0° C. to about 120° C., or suitably in the range of 0° C. to 70° C. The first and the second light emitting materials can be placed in contact with each other, spaced apart or dispersed into the same polymer matrix.

The first light-emitting material includes low reabsorbing (abbreviated herein as LR) semiconductor nanocrystals, herein referred to as LR quantum dots, which have been described in PCT Application No. US 2010/001873, the disclosure of which is incorporated herein by reference in its entirety. LR quantum dots are specially designed quantum dots that include a core, an exterior protective shell, and an inner light-absorbing shell between the core and the exterior protective shell. The inner light-absorbing shell absorbs excitation light and the core emits light, wherein the emission wavelength is longer than the excitation wavelength. The protective shell provides photostability. LR quantum dots are especially suited for use in lighting applications.

Transition layers may be present between the core and the inner light-absorbing shell and between the inner light-absorbing shell and the protective shell to improve lattice matching. The transition layers can often contribute to emission, absorption, and protection. Thus, LR quantum dots frequently include an emission zone (the core and any transition layers that contribute to emission), an absorption zone (the inner light-absorbing shell and any transition layers that contribute to absorption), and a protection zone (the protective shell and any transition layers that contribute to protection).

LR quantum dots are designed to maximize light absorption at the excitation wavelength (high absorption coefficient) while minimizing the absorption at the emission wavelength and further provide a high photoluminescence (PL) quantum yield (QY). As used herein, "reabsorption" refers to a process in which the emission from one emitter is optically absorbed again by the same type of emitter or a different type of emitter.

In typical core/shell quantum dots, the core is designed for both absorption and emission while the shell is designed for protection. According to the present invention, the LR quantum dots have a core, middle shell, and outer shell. In this design the middle layer provides the absorption while the core provides the emission. These nanocrystals behave like doped quantum dots, where the host provides the absorption and the dopant provides the emission, but the present quantum dots are 'intrinsic quantum dots' without any dopant.

LR quantum dots are designed so that the absorption zone has a very large, controllable, tunable volume in comparison to the emission zone. As a consequence, LR quantum dots have a large Stokes' shift (well separated absorption and emission bands) reducing self-quenching of the emission to suitably less than 10%, desirably less than 5%, and preferably to less than 1% or even about zero. By comparison, conventional quantum dots often demonstrate substantial self-quenching; see Pradhan, N.; Goorskey, D.; Messing, J.; Peng, X., *An Alternative of CdSe Nanocrystal Emitters: Pure and Tunable Impurity Emissions in ZnSe Nanocrystals*. Journal of the American Chemical Society 2005, 127 (50), 17586-17587; Pradhan, N.; Peng, X., *Efficient and Color-Tunable Mn-Doped ZnSe Nanocrystal Emitters: Control of Optical Performance via Greener Synthetic Chemistry*. Journal of the American Chemical Society 2007, 129 (11), 3339-3347.

The bandgap (the difference in energy between the conduction band and the valence band) of the absorption zone preferably is larger than the emission zone, and the band offsets between two zones desirably are type-I. The emission zone (core) preferably has the narrowest bandgap and the protection zone (outer shell) desirably has the widest bandgap. The bandgap of the absorption zone (inner light-absorbing shell and any transition layers that contribute to absorption) ideally is in the middle of those of the emission zone and protection zone.

Although not limited to II-VI and III-V semiconductors, the complex nanocrystals disclosed here can be readily realized using these two families of semiconductors and their alloys, which have similar crystal structure and tunable lattice constants. Furthermore, these two families of semiconductors are mostly direct bandgap. As used herein, the term II/VI compound or II/VI material refers to a compound including a group II element (also referred to as a group 12 element) and a group VI element (also referred to as group 16 element). As used herein, the term III/V compound or III/V material refers to a compound including a group III element (also referred to as a group 13 element) and a group V element (also referred to as group 15 element).

For conventional quantum dots, the wavelength of emission monotonically increases as the size of the nanocrystals increases and nanocrystals of different sizes can be prepared that emit from a specific color range, with comparatively pure color emissions. This means that, as the size of a conventional quantum dot increases, the resulting wavelength of emission shifts from blue to red. In the case of LR quantum dots, however, the emission color of the semiconductor nanocrystals is not monotonically dependent on the size of the semiconductor nanocrystals. In many cases, the LR dot absorption zone can reduce the quantum confinement of the exciton in the emission zone in a controllable fashion. As a result, in order to achieve desired optical performance in devices, the emission color of the semiconductor nanocrystals will be mainly tuned by composition and structure of the semiconductor nanocrystals, although their size sometimes remains as one means for color tuning.

In certain embodiments, preferred LR quantum dots are highly monodisperse in size. In one embodiment, a population of LR quantum dots emitting light in the first wavelength range is substantially monodisperse, that is, they exhibit less than a 15% rms (root mean square) deviation in diameter, suitably less than 10%, and preferably less than 5% rms deviation in diameter of the nanocrystals for some applications. In some embodiments, the size distribution of LR-dots does not need to be monodisperse.

Another feature of LR quantum dots is excellent lattice matching properties. Lattice matching in multishelled quantum dots is very important to prevent defects that can lead to a loss in efficiency. Traditionally, lattice matching is centered around the core of a nanocrystal because the focus is on the emission properties of the nanocrystals. In the case of LR quantum dots, lattice matching is designed around the inner light-absorbing shell because of its large volume.

FIG. 1 represents the schematic diagram of the nanocrystal structure, including emission zone (core) 10, absorption zone (inner light-absorbing shell) 11 for adjusting reabsorption energy transfer, the protection zone (outer shell) 12 providing photostability, and ligands 13. For a typical LR nanocrystal, the core can have a dimension of from about 1 to 10 nm, the inner light-absorbing shell layer(s) can have a thickness of from about 1 to 100 nm, and the exterior protection layer can have a thickness of from about 1 to 1000 nm.

Core

To make the main absorption band efficiently separated from the emission peak, the thickness of the absorption zone preferably has a substantially greater volume than the emission zone. Though the exact thickness can be determined by the volume extinction coefficients of the absorption zone and emission zone, two to twenty monolayers of the chosen material (a relatively wide bandgap semiconductor in comparison to the emission zone) would be typical for an emission zone, with about 0.3 to 0.4 nm thickness per monolayer. For typical II-VI and III-V semiconductors, this special example provides an absorption zone approximately being about 5 to 500 times in volume of the emission zone.

From the discussion above, one can see that it would be very advantageous to use a small emission core. The emission peak position of the resulting nanocrystals, however, is tunable by allowing the excitons centered at the emission zone to partially delocalize into the absorption zone. In other words, one can tune the bandgap emission peak by designing the absorption layer as well.

The core is a semiconductor nanocrystalline material, typically the combination of at least one metal and at least one non-metal. The core is prepared by combining a cation precursor(s) with an anion precursor(s). The metal for the host (or the plain core) is most preferably selected from Zn, Cd, Hg, Ga, In, Ti, Pb or a rare earth. The term rare-earth or rare-earth metal, as used herein, refers to the lanthanides, the actinides, and Sc, Y, and La. Thus, in this aspect, Sc, Y, and La are encompassed by the terms transition metal and rare-earth metal. The non-metal is most preferably selected from O, S. Se, P, As, or Te. The cationic precursor ions could include all transition metals and rare earth elements, and the anionic precursor ions may be chosen from O, S, Se, Te, N, P, As, F, Cl, and Br. As used herein, transition metals include, but are not limited to, Ti, Zr, Hf, V, Nb, Ta, Cr, Mo, W, Mn, Tc, Re, Fe, Ru, Os, Co, Rh, Ir, Ni, Pd, Pt, Cu, Ag, and Au, Pb, Sn. Also as used herein, including in the context of providing core materials, Sc, Y, and La are also considered transition metals.

The cation precursors can comprise elements or compounds, for example, elements, covalent compounds, or ionic compounds, including but are not limited to, oxides, hydroxides, coordination complexes or metal salts, that serve as a source for the electropositive element or elements in the resulting nanocrystal core or shell material.

The cation precursor solution can comprise a metal oxide, a metal halide, a metal nitride, a metal ammonia complex, a metal amine, a metal amide, a metal imide, a metal carboxylate, a metal acetylacetonate, a metal dithiolate, a metal carbonyl, a metal cyanide, a metal isocyanide, a metal nitrile, a metal peroxide, a metal hydroxide, a metal hydride, a metal ether complex, a metal diether complex, a metal triether complex, a metal carbonate, a metal phosphate, a metal nitrate, a metal nitrite, a metal sulfate, a metal alkoxide, a metal siloxide, a metal thiolate, a metal dithiolate, a metal disulfide, a metal carbamate, a metal dialkylcarbamate, a metal pyridine complex, a metal bipyridine complex, a metal phenanthroline complex, a metal terpyridine complex, a metal diamine complex, a metal triamine complex, a metal diimine, a metal pyridine diimine, a metal pyrazolylborate, a metal bis(pyrazolyl)borate, a metal tris(pyrazolyl)borate, a metal nitrosyl, a metal thiocarbamate, a metal diazabutadiene, a metal dithiocarbamate, a metal dialkylacetamide, a metal dialkylformamide, a metal formamidinate, a metal phosphine complex, a metal arsine complex, a metal diphosphine complex, a metal diarsine complex, a metal oxalate, a metal imidazole, a metal pyrazolate, a metal-Schiff base complex, a metal porphyrin, a metal phthalocyanine, a metal subphthalocyanine, a metal picolinate, a metal piperidine complex, a metal pyrazolyl, a metal salicylaldehyde, a metal ethylenediamine, a metal triflate compound, or any combination thereof. Preferably, the cation precursor solution can comprise a metal oxide, a metal carbonate, a metal bicarbonate, a metal sulfate, a metal sulfite, a metal phosphate, metal phosphite, a metal halide, a metal carboxylate, a metal hydroxide, a metal alkoxide, a metal thiolate, a metal amide, a metal imide, a metal alkyl, a metal aryl, a metal coordination complex, a metal solvate, a metal salt, or a combination thereof. Most preferably, the cation precursor is a metal oxide or metal salt precursor and can be selected from zinc stearate, zinc myristate, zinc acetate and manganese stearate.

Anion precursors can also comprise elements, covalent compounds, or ionic compounds that serve as a source for the electronegative element or elements in the resulting nanocrystal. These definitions anticipate that ternary compounds, quaternary compounds, and even more complex species may be prepared using the methods disclosed herein, in which case more than one cation precursor, more than one anion precursor, or both, may be used. When dual or multiple, cation elements were used in the growth of a given monolayer, the resulting nanocrystals were cation-alloyed at the given monolayer if the other part of the nanocrystals contained only a single cation. The same method can be used for the preparation of anion-alloyed nanocrystals.

In one aspect of this invention, the methods disclosed herein are applicable to core/shell nanocrystals prepared using a range of cation precursor compounds for the core and the shell material, for example, precursors of the group. II metals (for example, Zn, Cd, or Hg), the group III metals (for example, Al, Ga, or In), the group IV metals (for example, Ge, Sn or Pb), or the transition metals (including, but not limited to, Ti, Zr, Hf, V, Nb, Ta, Cr, Mo, W, Mn, Tc, Re, Fe, Ru, Os, Co, Rh, Ir, Ni, Pd, Pt, Cu, Ag, Au, and the like).

The useful core material may be selected from CdSe, CdS, CdTe, CdO, ZnSe, ZnS, ZnO, ZnTe, HgSe, HgS, HgTe, HgO, GaAs, GaP, InP, InAs, $In_2O_3$, $TiO2$ or a rare earth oxide, and an alloy formed between these compounds. The core can comprise a II/VI compound, or a III/V compound, or an alloy of them. The preferred group II elements are Zn, Cd, or Hg and the preferred group VI elements are O, S, Se, or Te. The preferred group III elements are B, Al, Ga, In, or Tl and the preferred group V elements are N, P, As, Sb, and Bi.

Inner Light-Absorbing Shell

The inner light-absorbing shell and certain transition layers that may surround the inner light-absorbing shell are referred to herein as the absorption zone. The principle function of this region is to absorb light and it preferably has a significantly large absorption cross-section in comparison to the emission zone and protection zone. The relatively large volume provides an extremely high absorption coefficient at the excitation wavelength (volume increases as a cubic function of the radius). To maximize the absorption coefficient, the absorption zone preferably is a direct bandgap semiconductor.

Though the exact thickness of the shell can be determined by the volume extinction coefficients of the absorption zone and emission zone, about two to about twenty monolayers of the chosen material (a relatively wide bandgap semiconductor in comparison to the emission zone) would be typical for a emission zone with a size of about 2 nm. For typical II-VI and III-V semiconductors, this special example provides an absorption zone approximately being about 5 to about 500 times in volume of the emission zone. In one embodiment, the ratio of the volume of the inner light-absorbing shell to the emission-center core is at least about 10 or greater, suitably at least about 50 or greater, and desirably at least about 100 or greater.

The composition of the inner light-absorbing shell may be the same or different than the composition of the core. Typically, the lattice structure of the inner light-absorbing shell material is similar to the type of material chosen for the core. As an example, if CdSe is used as the emitting zone material, the absorption zone material could be CdS. Inner light-absorbing shell materials are chosen to provide good absorption characteristics and can depend on the light source. For example, when the excitation comes from a typical blue LED (in the wavelength range between 440 and 470 nm) for solid-state-lighting, CdS is a good choice for the absorption zone. In another example, if the excitation is from a purple LED for making a red LED through frequency down-conversion, ZnSe or $ZnSe_xS_{1-x}$, where $0 \le x \le 1$, is a good candidate as the absorption zone. For a third example, if one wants to obtain near infrared emission from quantum dots for bio-medical applications (700-1000 nm) by using a red light source, CdSe and InP often work well as the absorption zone material.

Protective Shell

The protection zone (wide bandgap semiconductor or insulator) at the outmost shell of the LR dot provides needed chemical and photo-stability for the LR quantum dots. Usually, the protective shell, also called the protection zone, neither efficiently absorbs light in the preferred excitation window described above nor emits targeted photons. This is so because of its wide bandgap. For example, ZnS and GaN are examples of protective shell materials. Metal oxides may also be utilized. In certain embodiments, organic polymers can be used as the protective shell. The thickness of the protection shell is typically in the range between 1 and 20 monolayers. Further increasing the thickness is possible if needed but this increases the cost of production.

Transition Layers

The use of transition layers corresponding to a graded shell can minimize the interface defects when they are placed between the core and the inner light-absorbing shell and between the inner light-absorbing shell and the protective shell. The transition layers can improve lattice matching and reduce lattice strain. They are especially useful at the interface between the emission zone and absorption zone. For LR quantum dots, the lattice matching is suitably centered at the inner light-absorbing shell because it has a large volume in comparison to the core.

Figure 2:
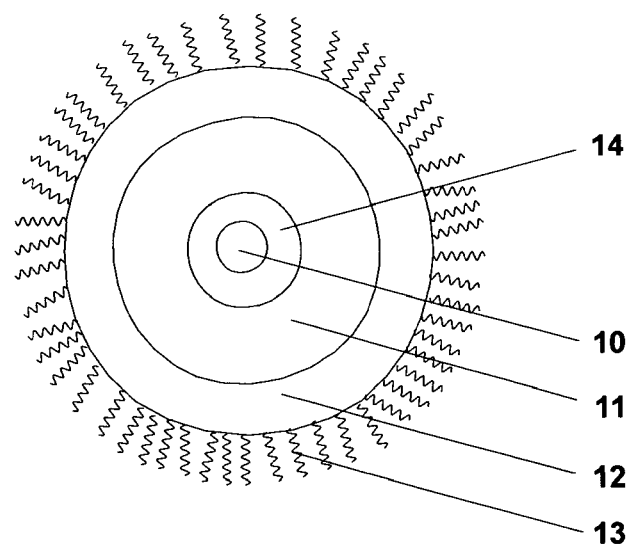
FIG. 2 represents the schematic diagram of the nanocrystal structure, including emission zone (core), transitional layers between the core and the inner light-absorbing shell, absorption zone (inner light-absorbing shell and any transition layers that contribute to absorption) and protection zone (outer shell).

There is preferably a transitional series of layers 14 located between the emitting core 10 and the light-absorbing inner shell 11, as is illustrated in FIG. 2. For example, if CdS is chosen as the absorption zone material and a typical red emitter, such as 620 nm, is targeted, the emission zone could be a $CdSe_xS_{1-x}$ core nanocrystal, where $0 \leq x \leq 1$. By decreasing x in this formula to about 0.5, one could reduce the lattice mismatching down to about 2-3%. For the same example, if ZnS is chosen as the protection zone, $Cd_xZn_{1-x}S$ could be used as the transition layer between the absorption zone and protection zone, in which x or each monolayer increases from the CdS zone to the ZnS zone. The lattice mismatch in between CdS and ZnS is about 8% and can be reduced to about 1% between CdS and $Cd_xZn_{1-x}S$ if x is around 0.9. In this way, the lattice mismatch will be reduced very efficiently. The resulting nanocrystals often show a photoluminescence (PL) quantum yield in the range between 70-90%.

Usually, the transition layers between absorption zone and protection zone can also offer some absorption properties because such transition layers can have a composition close to that of the absorption layer. For example, if CdS is chosen as the absorption zone and ZnS is chosen as protection zone, one could use $Cd_xZn_{1-x}S$ as the transition layers. When x is greater 0.5, it could contribute some absorption to wavelengths below about 460 nm.

The emission zone and the absorption zone do not need to be a pure semiconductor material. To achieve a certain absorption band, one might use an alloyed absorption shell with a defined composition. Semiconductor science textbooks can teach one to tune the absorption band by alloying. However, it is desirable to optimize the lattice matching between these two critical zones.

In one desirable embodiment, the inner light-absorbing shell includes a plurality of monolayers forming a compositional gradient. For example, the inner light-absorbing shell can include three components varying in a ratio of 1:0:1 in the monolayer located closest to the core to a ratio of 0:1:1 in the monolayer located closest to the protective shell. By way of example, three useful components are Cd, Zn, and S and for instance, a monolayer closest to the core could have the composition CdS (ratio of 1:0:1), a monolayer located closest to the protective core could have a composition corresponding to ZnS (ratio of 0:1:1), and an intermediate monolayer between the core and the protective shell could have a composition corresponding to $Cd_xZn_{1-x}S$, which has a ratio of (x):(1−x):1, and wherein $0 \leq x \leq 1$. In this example, x is greater for monolayers that are closer to the core relative to those that are closer to the protective shell. In another embodiment, the transition shell includes three components varying in a ratio of 0.9:0.1:1, 0.8:0.2:1, 0.6:0.4:1, 0.4:0.6:1, and 0.2:0.8:1 from the monolayer located closest to the core to the monolayer located closest to the protective shell. Other combinations of Cd, Zn, S, and Se alloy can also be applied in the place of $Cd_xZn_{1-x}S$ as the transition shell as long as it has a suited lattice matching parameter. An illustrative example of a suitable transition shell includes one having Cd, Zn, and S components and the following layers listed from the layers closest to the light-absorbing shell to the ones closest to the protective shell: $Cd_{0.9}Zn_{0.1}S$, $Cd_{0.8}Zn_{0.2}S$, $Cd_{0.6}Zn_{0.4}S$, $Cd_{0.4}Zn_{0.6}S$, $Cd_{0.2}Zn_{0.8}S$.

Ligands

To prevent aggregation of LR quantum dots it is often desirable to use organic ligands to protect and passivate the surface of the quantum dot. Suitable passivating ligands are often included in the solvent in which the nanoparticles have been prepared, and often are Lewis base compound having a lone pair of electrons capable of coordinating with the surface of the nanoparticle. The cation precursor solution may also include a mono- and polydentate ligand selected from a fatty acid; a fatty amine; alkyl-amines (hexadecylamine, octylamine etc.); aryl-amines; pyridines; compounds with carboxylic acid group(s); compounds with thiol groups; a phosphine, for example, trioctylphosphine, triphenylphosphine, or t-butylphosphine; a phosphine oxide, for example, trioctylphosphine oxide, triphenylphosphine oxide etc.; a phosphonic acid, such as an alkyl phosphonic acid; a phosphinic acid; a sulphonic acid, or any combination thereof, any one of which having up to about 30 carbon atoms or any one of which having up to about 45 carbon atoms. The ligand can be selected from the group consisting of tributyl phosphine (TBP) and octadecylamine (ODA). The ligand can also be selected from the group consisting of dodecylamine (DA), hexadecylamine (HA), octadecylamine (OA), trioctylamine, oleyl amine, stearic acid (SA), lauric acid (LA), oleic acid, hexylphosphonic acid (HPA), tetradecylphosphonic acid (TDPA), and trioctylphosphine oxide (TOPO).

The ligands mentioned above can end up on the outer surface of the nanocrystals synthesized. When a mixture of ligands is used in a reaction system, the exact ligands to be found on the surface of the nanocrystals depend on the reaction conditions, coordination capability of the ligands, the mobility of the ligands on the surface of the nanocrystals.

Emission Properties

The emission spectrum and absorption spectrum of LR quantum dots are well separated because the bandgap of the emission center is preferably significantly narrower than that of the absorption zone and the absorption zone has a significantly large absorption cross-section in comparison with the emission center. By tuning the composition and structure of LR quantum dots, one can readily vary their emission color. Thus, for LR quantum dots emission color is not necessarily closely related to the size of the dot, but instead, mainly related to its composition and structure.

The main advantage of the LR quantum dots in terms of function is that the semiconductor nanocrystals minimize undesired quenching through reduced reabsorption energy transfer, which is intrinsic for conventional phosphors and common core and core/shell quantum dots. This is especially the case when additional light-emitting materials are present. The advantage is desirable for any application when a high concentration of nanocrystals, a close proximity between nanocrystals, and/or a long optical path length are needed. However, this advantage is substantial only if the emission quantum yield is sufficiently high, which is realized by several factors. Firstly, the physical separation of the absorption and emission minimizes Auger effect and other non-linear processes. Secondly, judiciously designing the structure/composition of the nanocrystals eliminates charge trap states within the emission zone and absorption zone. Thirdly, the protection zone (outer shell) forces the photo-generated (or electro-injected in the case of electroluminescence) charges to efficiently fall into the emission zone.

Figure 3:
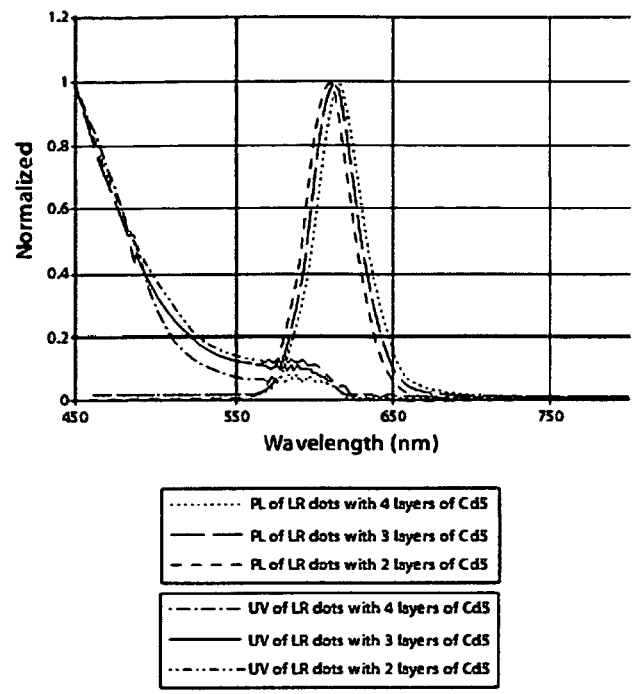
FIG. 3 represents a plot of the UV and photoluminescence (PL) spectra of CdSeS/CdS/ZnS core-shell nanocrystals.

FIG. 3 represents a plot of the UV and photoluminescence (PL) spectra of CdSeS/CdS/ZnS core-shell nanocrystals with different thickness of the absorption zone. As the thickness of the absorption shell (CdS) increases, the absorption of the resulting LR quantum dots between 450 nm and emission peaks decreases. The Stokes shift and hence the separation of absorption and emission peaks increases. The reduction of the relative absorption in the wavelength range longer than about 520 nm is evident upon the thickness increase of the CdS inner light-absorbing shell (absorption zone). Thus, this indicates that a thick absorption zone, as present in LR quantum dots, is highly desirable. As reference, the absorbance at 450 nm was normalized for all samples.

Reabsorption Metrics

LR quantum dots are optimized for both absorption and emission properties, i.e., with a low reabsorption and high emission yield. High emission yield can be readily specified by the commonly used photoluminescence quantum yield, which is defined as the number of photons emitted by the nanocrystals divided by the number of photons absorbed by the same nanocrystals. For low reabsorption, there is no existing parameter in nanocrystal literature to describe such properties. In this disclosure, we define "absorbance ratio" to fulfill this goal. Ideally, a nanocrystal emitter preferably absorbs as many high energy photons from the excitation light source as needed and does not absorb any photons in the lower energy window at all.

In one option, "absorbance ratio" is defined as the ratio of the absorbance at the peak of the excitation light source to the absorbance at 550 nm. If the emission peak of the nanocrystals locates at a wavelength higher than 550 nm, this option works well. The reason to choose 550 nm is because 550 nm is the most sensitive wavelength for human eyes under ambient conditions. As a result, it is critical not to quench this part of the emission of a device, which is extremely important for the lighting and display industry. This absorbance ratio is termed as "$I_{excitation}/I_{550}$" in this disclosure. For example, if the excitation peak of a blue LED is at 450 nm (a common peak position for a high power and high efficiency blue LED), the relevant absorbance ratio is "$I_{450}/I_{550}$". In certain embodiments useful LR quantum dots have an absorbance ratio of greater than about 8, suitably equal to or greater than about 10, or equal to or even greater than about 15.

Alternatively, one can define "absorbance ratio at the emission peak" that is calculated by dividing the absorbance at the peak of the excitation light source and the absorbance at the emission peak of the nanocrystals. This parameter is written as "$I_{excitation}/I_{emission}$" in this disclosure. For example, if the peak of excitation light source is 450 nm, "absorbance ratio at the emission peak" is "$I_{450}/I_{emission}$". Desirably, the absorbance ratio at the emission peak is greater than 8, suitably greater than 10, or even greater than 15.

Obviously, the higher the absorbance ratio is (in either of two definitions described above), the better a nanocrystal sample is for lighting and display applications. This is particularly true for nanocrystal emitters with their emission peak at a wavelength longer than 550 nm. However, preferably a high absorbance ratio (in either of two forms) can be coupled with a high emission quantum yield to provide a significant advantage. In one embodiment, the emission quantum yield is greater than about 40%, suitably greater than about 50%, and desirably greater than about 70% or even greater than about 80%.

Second Light-Emitting Material

Preferably, at least a second light-emitting material is present that is positioned to receive at least a portion of the light from the light source. Thus, both the first and second light-emitting materials are optically coupled to the light source. The second light-emitting material is capable of emitting light having an emission maximum in a third wavelength range, for example, green light or yellow-green light. In one embodiment, the third wavelength range is from about 500 nm to about 600 nm. Preferably, the second emitter possesses a peak at around 550 nm but with a broad emission peak to cover the low end of the visible window, namely below 600 nm. This can be a conventional phosphor, or a mixture of phosphors, a semiconductor nanocrystal, and a mixture of semiconductor nanocrystals.

In one suitable embodiment the second light-emitting materials include phosphor materials such as bulk phosphors or phosphors particles. Examples of useful phosphor materials include silicate-based phosphors and garnet-based phosphors, including the YAG phosphor. Further non-limiting examples of useful phosphors include: $Y_3(Al,Ga)_5O_{12}$:Ce; ZnS:Cu, Al; ZnS:Cu,Au,Al; $Zn_2SiO_4$:Mn,As; $Sr_3SiO_5$:Eu; Y2OS:Tb, Y2SiO5:Tb; $BaMgAl_{10}O_{17}$:Eu Mn; $SrAlO_4$:Eu, Dy; $(YGdCe)_3Al_5O_{12}$:Eu; $Sr_4Al_{14}O_{25}$:Eu; (Ce, Tb)$MgAl_{11}O_{19}$; or (La, Ce, Tb)$PO_4$, LaPO4:Ce,Tb, (La, Ce,Tb)$PO_4$, (La, Ce,Tb)PO4:Ce,Tb; YAG:Ce and mixtures thereof. Examples of useful phosphors include those described in U.S. Pat. No. 5,998,925 to Yoshinori Shimizu et al. and U.S. Pat. No. 7,750,359 to Narendran et al, both incorporated herein by reference in their entirety.

In one embodiment, the first light-emitting material includes a first type of LR quantum dots and the second light emitting material includes a second type of LR quantum dots. In this embodiment, the second type of LR quantum dots absorb light from the light source and emit light having a maximum emission in the third wavelength range, for example, in the green or yellow-green region of the spectrum. Many aspects of LR quantum dots have been described previously and illustrative examples of useful LR quantum dots of the second type include $CdSe/CdSe_xS_{1-x}/CdS/Cd_xZn_{1-x}S/ZnS$, $CdSe_xS_{1-x}/CdS/Cd_xZn_{1-x}S/ZnS$, $Cd_xZn_{1-x}Se/CdS/Cd_xZn_{1-x}S/ZnS$, and alike.

In a certain embodiments, a third type of core/shell quantum dots or LR quantum dots can be present that absorb light from the light source and emit light having a maximum emission in a fourth wavelength range, for example, in the blue or blue-green region of the spectrum. Suitably, the fourth wavelength range is from about 400 to about 500 nm, and desirably from about 440 nm to about 480 nm. Examples of useful quantum dots or LR quantum dots of this type include $Cd_xZn_{1-x}Se/CdS/Cd_xZn_{1-x}S/ZnS$, $ZnSe/ZnSe_xS_{1-x}/ZnS$, and alike.

Coating Light-Emitting Materials

Desirably, LR quantum dots are incorporated into the device while remaining as fully mono-dispersed as possible and without significant loss of quantum efficiency. Although LR-dots are quite robust towards chemical oxidation and photooxidation, it is still preferable to protect nanocrystals from oxygen, which can migrate to the surfaces of nanocrystals leading to photo-oxidation and a loss in quantum yield. Such protection methods include embedding the nanocrystals within inorganic and/or organic matrix layers with low oxygen permeability, sandwiching nanocrystals specimen within solid polymer plates, and/or sandwiching nanocrystals within glass pieces, or applying protective materials to the nanocrystals themselves.

In one preferred embodiment, light-emitting materials are combined with one or more coating materials, sometimes referred to as host materials. Non-limiting examples of useful coating materials include silicone, for example, silicone-based polymers and siloxane-based polymers such as polydimethylsiloxane, polydimethyl-methylphenylsiloxane, polymethyl-phenylsiloxane, polyphenyl-T resin, polyfluoro-silicones, tetramethyltetra-phenyltrisiloxane, silanes or mixtures thereof, and especially polydimethylsiloxane, derivatives of silicon, epoxy, and (meth)acrylate. Other useful coating materials include photocurable resins, for example, useful photo-polymerizable resins include materials such as mercapto functional esters, vinyl ethers, sctylate, an acrylic acid or methacrylic acid based resin containing a photo reactive vinyl groups, waxes, and oils. Examples of additional useful resins include heat-curable resins.

The materials can be coated on a substrate by spray coating, spin coating, flow coatings, and dip coating. The preferred substrate could, for example, be glass or transparent plastics including PMMA, and polycarbonate. The light-emitting materials can be embedded in a coating material that forms a matrix using any suitable method, for example, mixing the nanocrystals in a polymer and casting a film or laminate, mixing the nanocrystals with monomers and polymerizing them together, mixing the nanocrystals in a sol-gel to form an oxide, or any other methods known to those skilled in the art. In one preferred embodiment the light-emitting material are uniformly distributed throughout a matrix, in other embodiments, the light-emitting material can be more concentrated in one region relative to another.

The concentration of LR dots in a matrix is 0.01% to about 10%, the preferred ranges is 0.1% to 5%, suitably 0.1% to 2% and even more preferred range is 0.4% to 1.5%. The coating thickness is typically between 0.1 to 2 mm.

In one embodiment, the first and second light-emitting materials are coated in one or more layers. In another suitable embodiment, the first and second light-emitting materials are mixed together and coated in the same layer. In a further embodiment, the first and second light-emitting materials are in separate layers.

In certain embodiments it is desirable to incorporate LR quantum dots into polymeric beads before coating them and incorporating them into a matrix. This protects the quantum dots from the adverse effects of moisture and oxygen, and the beads can then be coated in the device. Examples of polymers that can be used to form the beads can include poly(methyl (meth)acrylate), poly(ethylene glycol di methacrylate), poly (vinyl acetate), poly(divinyl benzene), poly(thioether), silica, polyepoxide, and/or combinations thereof.

Quantum dots may be located within a silica shell, polymer microspheres, encapsulated in a silica gel matrix or vinyl polymer particles, hermetically sealed using polymers such as poly(vinyl butyral):poly(vinyl acetate), epoxies, urethanes, silicone, and derivatives of silicone, including, polyphenylmethylsiloxane, polyphenylalkylsiloxane, polydiphenylsiloxane, polydialkylsiloxane, fluorinated silicones and vinyl and hydride substituted silicones, acrylic polymers and copolymers formed from monomers including methylmethacrylate, butylmethacrylate and laurylmethacrylate, styrene based polymers, and polymers that are crosslinked with difunctional monomers, such as divinylbenzene. The surface of the quantum dot may be modified with reactive polymers that can later be polymerized to form a polymer matrix.

Optical Element

An optical element in the present invention is a layer of quantum dots applied to a substrate. In one embodiment, an optical element is spaced apart from the light source, and positioned to receive at least a portion of the light from the light source. Desirably, the optical element includes a substrate which, in some embodiments, is rigid, and in other embodiments the substrate can be flexible. Preferably the substrate is optically transparent to light emitted from the light source and to light emitted from the light-emitting materials. The substrate is formed from suitable materials that provide support, but do not inhibit the function of the light-emitting device. For example, in some embodiments, suitable materials include glass, silicone, quartz, sapphire, and polymers and plastics such as, for example, polycarbonate, and acrylic materials, epoxies, esters, Nylon, polycyclo-olefins and urethanes. In certain embodiments, the optical component including the substrate can serve as a cover plate for the lighting-emitting device. In one suitable embodiment, the substrate can include light diffusers or light scatterers. Non-limiting examples of light scatterers include small particles composed of glass, polymers; and metal oxides such as $TiO_2$, $SiO_2$, and $BaSO_4$. In another embodiment, light scatterers are present in one or more light-emitting layers.

In one embodiment, the optical element includes the first light-emitting material and, thus, includes LR quantum dots. In certain embodiments, the LR quantum dots are coated on the surface of the substrate. In other embodiments, the LR quantum dots are incorporated into the interior of the substrate. For example, the substrate can include a hollow portion and the LR dots can be placed therein.

In a further embodiment, the second light-emitting material is dispersed with the first light-emitting material and coated on the substrate or placed inside the substrate. In another embodiment, the second light-emitting material is coated on the substrate, but is in a separate layer from the first light-emitting material. In a further embodiment, the second light-emitting material is contained in a layer that is coated on the substrate and that layer is positioned between the light source and a layer containing the first light-emitting material. In one desirable embodiment, the optical element contains the first light-emitting material and the second light-emitting material is contained in a layer adjacent to the light source.

In certain embodiments the device includes a reflective surface optically coupled to the light source and optionally also coupled to the light emitting materials. For example, the device can include a reflector cup having an angled reflective surface. In one embodiment the light source is placed at the bottom of the reflector cup and the light-emitting materials are placed above the light source. The reflector can direct scattered light back toward the center of the device and improve luminance efficiency. U.S. Pat. No. 7,816,855 to Cho et al., the disclosure of which is incorporate herein in its entirety, describes an example of a useful reflector cup.

In a preferred embodiment, light emitted from the device includes at least a portion of the light emitted by the light source, and the light emitted by the first and second light-emitting materials. Desirably, the light-emitting device produces white light having a high color rendering index (CRI), which is a quantitative measure of the ability of a light source to reproduce the colors of various objects faithfully in comparison with an ideal or natural light source. By using a suitable light source and properly selecting the light-emitting materials one can generate white light having a CRI greater than about 80, greater than about 85, or even greater than about 90. A useful method of producing white light having a high CRI includes using the light source to generate a first light having a maximum emission in the blue region of the spectrum, for example, in the wavelength range of about 440 nm to about 490 nm. A first portion of the source light is absorbed by the first light-emitting material, which emits a second light in the orange to red region of the spectrum, for example, having a maximum emission in a wavelength range from about 600 nm to about 640 nm; and a second portion of the source light is absorbed by the second light-emitting material, which emits a third light in the green to yellow-green region of the spectrum, for example, having a maximum emission in a wavelength range from about 500 nm to about 600 nm. Thus, in this embodiment, light emitted by the device includes the first, second, and third lights.

In certain embodiments, the light source emits UV light; in this case, it is often desirable to have at least a third light-emitting material present. For example, materials that can absorb a portion of the UV light and emit blue light. Useful materials include phosphors, conventional quantum dots, and LR quantum dots. In this case it is preferred that the device does not emit substantial amounts of UV light. White light emission can be obtained by proper choice of the light-emitting material and by combining their emitted light.

Figure 4:
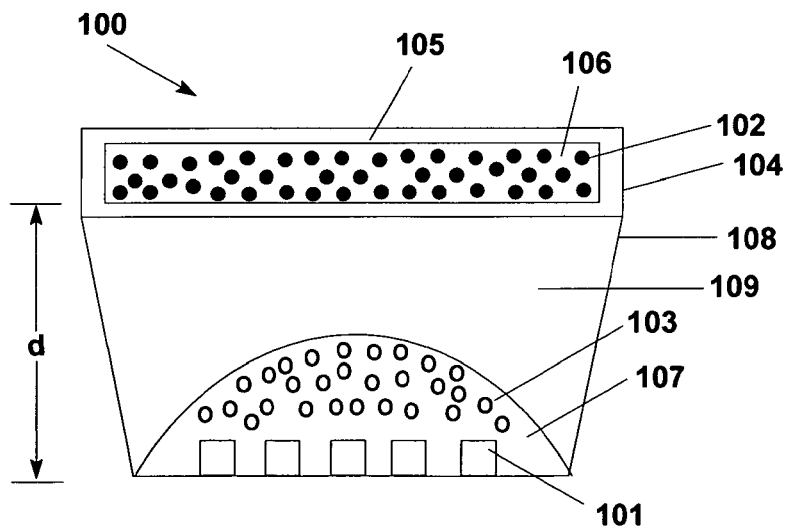
FIG. 4 shows a schematic cross-sectional view of a light-emitting device that represents one embodiment of the present invention.

FIG. 4 depicts a schematic representation of one embodiment corresponding to device 100 containing a light source including multiple LED chips 101, an optical element 104 including substrate 105 and a first light-emitting material 102 corresponding to LR quantum dots, a second light-emitting material 103 corresponding to phosphor particles, and a reflector cup 108. In this embodiment, the LR quantum dots 102 are dispersed in a polymer matrix 106 and enclosed in the substrate 105; the phosphor particles are encapsulated in a polymer matrix 107, which also partially encapsulates the LED chips 101. The LR dots are spaced apart from the light source by distance d. The distance of d is typically selected so that the temperature of the LR dot based optical element is desirably less than 120° C., or suitably less than 85° C., or even less than 70° C. or lower. The space 109 between the two light emitting materials 102 and 103 can be vacant or filled with a transparent material such as a transparent polymer. In this embodiment, the LED chips 101 emit blue light, and a portion of that light is absorbed by the LR quantum dots 102, which then emit red or orange light. A portion of the blue light is also absorbed by the phosphor particles 103 and re-emitted as green or yellow-green light. The emitted light combines to form white light.

Figure 5:
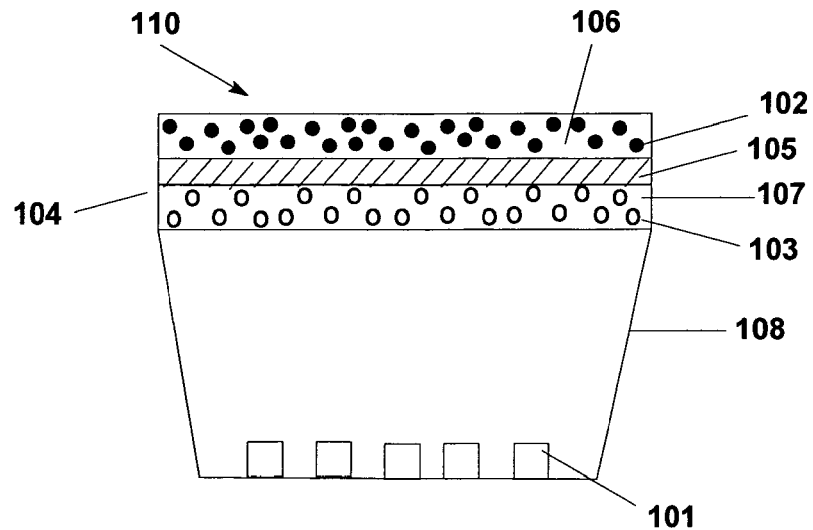
FIG. 5 shows a schematic cross-sectional view of a light-emitting device that represents another embodiment of the present invention.

FIG. 5 depicts a schematic representation of another embodiment, corresponding to device 110, and including LED chips 101 and optical element 104 containing LR quantum dots 102 dispersed in a polymer matrix 106 and coated on substrate 105. Phosphor particles 103, which are dispersed in a second polymer matrix 107 are also coated on the substrate 105 and are positioned between the LR quantum dots and the light source. Reflector cup 108 controls any back scattering of the emitted light. The location of the LR dot layer and the phosphor particle layers are interchangeable.

Figure 6:
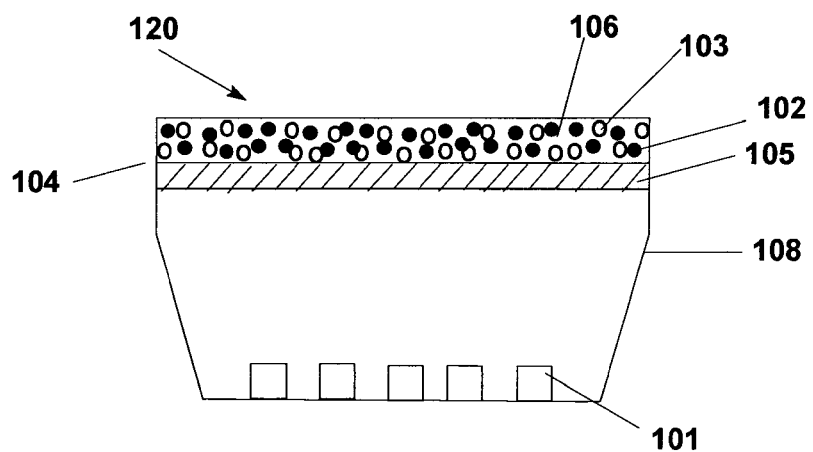
FIG. 6 shows a schematic cross-sectional view of a light-emitting device that represents another embodiment of the present invention.

FIG. 6 depicts a schematic representation of a further embodiment, corresponding to device 120, and including LED chips 101 and optical element 104 containing LR quantum dots 102 dispersed in a polymer matrix 106 and coated on substrate 105. Phosphor particles 103 are mixed with the LR quantum dots and also dispersed in matrix 106.

Synthesis of Nanocrystals

LR quantum dots are preferably made by the modified methods described in U.S. Pat. No. 7,632,428 and U.S. Pat. No. 7,767,260, incorporated herein by reference in their entirety. Other useful synthetic methods are described in U.S. Pat. No. 6,869,545, U.S. Pat. No. 6,872,249, U.S. Pat. No. 7,153,703, U.S. Pat. No. 7,105,051, U.S. Pat. No. 7,160,525, U.S. Pat. No. 7,531,149, and U.S. Pat. Pub. 2008/0081016, the disclosures of which are incorporated herein by reference in their entirety.

A one-pot approach to the synthesis of LR quantum dots can be advantageous in that it is inherently a "greener synthesis routes" (fewer materials, reduced use of hazardous materials, greater yields). Useful synthetic methods are described by Xie R, Battaglia D, Peng, X, Journal of the American Chemical Society, 2007, Vol. 129, 15432. For a two-pot approach, the semiconductor nanocrystals are made by combining a nanocrystal core, a ligand, and at least one solvent in a reaction vessel, forming a first monolayer of an inner light-absorbing shell on said nanocrystal core by adding a first cationic precursor M1 and an anionic precursor X1 at T1, forming additional monolayers of the inner light-absorbing shell by adding a first cationic precursor M1, a second cationic precursor M2 and an anionic precursor X1 while cooling to T2 followed by heating to T1 or greater, and forming a protective exterior shell by adding said second cationic precursor M2 and said anionic precursor X1 while cooling to T2. Growth of the transition shells and protective shells follow similar procedures.

Solvent

The nanocrystals are prepared in a reaction utilizing solvent. The solvent can be a coordinating solvent or a non-coordinating solvent. The coordinating solvent can be selected from the group consisting of long-chain fatty amines, long-chain fatty acids, phosphine, phosphoric acids, and phosphine oxides. The solvent can be selected from the group consisting of octadecene (ODE), tributyl phosphine (TBP) and octadecylamine (ODA). The solvent can also be selected from the group consisting of dodecylamine (DA), hexadecylamine (HA), octadecylamine (OA), stearic acid (SA), lauric acid (LA), hexylphosphonic acid (HPA), tetradecylphosphonic acid (TDPA), and trioctylphosphine oxide (TOPO).

The non-coordinating solvent can be selected from water, hydrocarbon compounds, and other non-aqueous liquids. The non-coordinating solvent can also be selected from octadecene (ODE), ether, and ester.

Aspects of the current invention can be advantageously applied to solid-state-lighting, and other light-emitting applications wherein high color purity, high luminous efficiency, and improved light stability are desirable.

EXAMPLES

The invention and its advantages can be better appreciated by the following examples.

Example 1

Synthesis of LR Quantum Dots

Preparation of Reaction Solutions

Materials: Technical grade (90%) Octadecene (ODE), Indium acetate (In(Ac)$_3$, 99.99%), Tri-n-octylphosphine (TOP, 97%), Stearic acid (SA, 98%), oleic acid (90%), Zinc stearate (ZnO 12.5-14%), Tris-trimethylsily phosphine (P(TMS)$_3$, 95%) 1-octylamine (99%) were purchased from Alfa. Oleylamine (97%) and octadecylamine (ODA, 97%) were purchased from Aldrich. Copper stearate was prepared by well-known methods. All the chemicals were used without further purification.

Precursor Solutions 0.1M Cd Solution:

CdO (1.28 g) and 22.5 g OA (oleic acid) and 65.0 g ODE (1-Octadecene) were placed in a 250 ml round bottom flask. The mixture was heated to 250° C. under argon flow until clear. The solution was allowed to cool to room temperature and the reaction mixture was stored at room temperature. When needed, this mixture was re-heated to afford a clear solution, referred to below as the Cd solution.

0.1M Zn Solution:

ZnO (1.215 g) and 33.9 g OA (oleic acid, 30 ml) and 94.6 g ODE (1-Octadecene) were placed in a 250 mL round bottom flask. The mixture was heated to 240° C. under argon flow until clear. The reaction mixture was stored at room temperature. When needed, this mixture was re-heated to become a clear solution, referred to below as the Zn solution.

0.1M S Solution:

Sulfur (0.48 g) and 118.5 g ODE (1-Octadecene) were placed in a 250 mL round bottom flask. The solution was capped and heated until all the sulfur powder was completely dissolved. Once the sulfur had dissolved in the ODE the reaction was stable at room temperature. In some circumstances some of the sulfur had precipitated out of the solution. If this happened, the solution was re-heated until all the sulfur had re-dissolved.

Synthesis of CdSe Core Nanocrystals

For a typical reaction, a mixture of 0.2 mmol of CdO, 0.8 mmol of stearic acid and 2 g of ODE in a 25 ml three neck flask was heated to about 200° C. to afford a colorless clear solution. After this solution was cooled to room temperature, ODA (1.5 g) and 0.5 g TOPO were added to the flask. Under argon flow, this system was re-heated to 280° C. At this temperature, a selenium solution made by dissolving 2 mmol of Se in 0.472 g of TBP and further diluted with 1.37 g of ODE was quickly injected. The growth temperature was then reduced to 250° C. Typically this reaction generates CdSe nanocrystals of about 3.5 nm in size with the first absorption peak around 570 nm. The reaction mixture was allowed to cool down to room temperature, and a standard extraction procedure using hexanes/ODE-methanol two phase system was used to purify the nanocrystals from side products and unreacted precursors. The nanocrystals remained in the hexanes/ODE layer, and the unreacted precursors and excess amines were extracted into the methanol layer. The particle concentration of the purified CdSe solution in hexanes, as stock solution for core/shell growth, was measured using Beer's law. This solution was used for the growth of LR quantum dots.

Synthesis of LR Quantum Dot Shell

For a Typical Reaction:

1. To a 250 mL 3-neck round bottom flask, was added 15 g ODA (octadecylamine) and 15 g ODE (octadecene) and 2 g TOPO (trioctylphosphine oxide). The reaction flask was attached to a condenser.
2. CdSe nanocrystals prepared as described above were added to the reaction flask. The hexane used for dissolving the CdSe nanocrystals was boiled off with Ar flow. The growth of core/shell nanocrystals using the SILAR method is based on alternating injections of the Cd solution, Zn solution and S solution, made using the procedures disclosed above, into the solution containing the CdSe-core nanocrystals. The amount of the injection solution for each monolayer can be deduced from a calculation of the number of surface atoms using standard formula. This was done by determining the particle concentration and particle size in the solution and then calculating the amount of materials needed for the growth of the given amount of nanocrystals. The thickness of one monolayer was determined by molecular modeling, which, on average, yields about 0.3-0.4 nm thickness per monolayer for typical II-VI and III-V semiconductors.
3. The first injection was added to the reaction while at room temperature. This is usually the first and second CdS layers, injected together.
4. The reaction vessel was sealed and a flow of the inert gas was started.
5. The reaction was heated to 235° C. for at least 30 minutes.
6. The next layer was started by cooling the reaction mixture to 150° C. by adding the designated amount and type of injection solutions. Usually the cationic solution(s) was added first and followed by the S solution.
7. After all the precursors were added, the reaction was heated to a temperature in the range between 230° C. and 260° C. for the growth of the next layer. Usually, the more Zn solution (in comparison to Cd solution) there is, the higher the reaction temperature should be.
8. Steps 6-7 are repeated for each layer.
9. After the last injection, the reaction was cooled down and purified using a standard hexanes/ODE-methanol extraction method. If a solid form of nanocrystals is needed, precipitation of the nanocrystals can be achieved by adding acetone, ethyl acetate, or other polar solvent into the nanocrystals dissolved in the hexanes/ODE solution.

Synthesis of $CdSe_xS_{1-x}$ Alloy Core Nanocrystals

Separately, a selenium solution was made by dissolving 2 mmol of Se in 0.472 g of TBP and then further diluted with 1.37 g of ODE in a glove box, and a sulfur solution was made according to the procedure described above. For the synthesis of $CdSe_xS_{1-x}$ alloy core nanocrystals with a given Se:S ratio, the Se solution and S solution were mixed in the desired proportion to obtain a mixed anionic injection solution.

For a typical reaction, the mixture of 0.2 mmol of CdO, 0.8 mmol of stearic acid and 2 g of ODE in a 25 ml three neck flask is heated to about 200° C. to afford a colorless clear solution. After this solution was cooled down to room temperature, ODA (1.5 g) and 0.5 g TOPO were added to the flask. Under argon flow, this system was re-heated to 280° C. At 280° C., the mixed anionic injection solution with a certain volume was then injected into the reaction solution. The reaction mixture was reduced to 250° C. and maintained at this temperature for 2 to 20 minutes, dependent on the size of the nanocrystals needed. The reaction mixture was allowed to cool down to room temperature, and a standard extraction procedure using hexanes/ODE-methanol two phase system was used to purify the nanocrystals from side products and unreacted precursors. The nanocrystals remained in the hexanes/ODE layer, and the unreacted precursors and excess amines were extracted into the methanol layer. The particle concentration of the purified CdSe solution in hexanes, as stock solution for core/shell growth, was measured using Beer's law. This solution was used for the growth of the LR quantum dots.

Characterization of the Nanocrystals:

Transmission Electron Microscopy (TEM) and High Resolution TEM (HR-TEM): Low-resolution TEM images were taken on a JEOL 100CX transmission electron microscope with an acceleration voltage of 100 kV. Carbon-coated copper grids were dipped in the hexanes or toluene solutions to deposit nanocrystals onto the film. High-resolution TEM (HRTEM) pictures were taken using a Taitan microscope with an acceleration voltage of 300 kV.

X-ray powder diffraction (XRD) patterns were obtained using a Philips PW1830 X-ray diffractometer. Energy-Dispersive Spectroscopy (EDS) was used for elemental analysis using a Philips ESEM XL30 scanning electron microscope equipped with a field emission gun and operated at 10 kV. UV-vis spectra were recorded on an HP8453 UV-visible spectrophotometer. Photoluminescence (PL) spectra were taken using a Spex Fluorolog-3 fluorometer. The PL quantum yields of the nanocrystals were measured using a standard integration sphere protocol (Ocean Optics).

Table 1 provides detailed data about the effect of absorption shell (CdS) thickness (number of layers of CdS) on the ratio of absorption intensity (I) at 450 nm ($I_{450}$) and 550 nm ($I_{550}$) for the LR quantum dots whose spectra are shown in FIG. 3. The absorbance ratio between 550 nm and 450 nm ($I_{450}/I_{550}$), and between the absorbance at the emission peak and 450 nm ($I_{450}$/Iemission) is listed.

TABLE 1

Characterization of core/shell dots with different layers of CdS.

| Example | Layers of CdS | Layers of ZnS | Absorbance Ratio ($I_{450}/I_{550}$) | Absorbance Ratio at Emission Peak ($I_{450}$/Iemission) |
|---|---|---|---|---|
| 1-1 | 2 | 2 | 8 | 13.5 |
| 1-2 | 3 | 2 | 10 | 18.9 |
| 1-3 | 4 | 2 | 14 | 24.4 |

From Table 1 and FIG. 3, one can see that the emission peak shifted slightly to the red as the main light-absorbing shell (CdS) thickness increased from two monolayers to four monolayers. However, the absorption ratio increased substantially. In comparison, typical high quality conventional CdSe quantum dots with a similar emission peak position (~610 nm) have typically an $I_{450}/I_{550}$ absorption ratio lower than 3, and an $I_{450}$/Iemission absorption ratio lower than 2.5.

An LR quantum dot film which was fully cured in UV-curable polymer was placed in front of a LED source (single excitation wavelength @ 405 nm, 3.2V, 100 mA). The film thickness was 300 micrometer, the absorbance at 405 nm was about 1.2, and thus, about 94% of the 405 nm photons will be absorbed by the quantum dots. An anti-reflection film (3M CM592) was coated on the quantum dot film (facing LED source) so that all emitted photons could be collected by an integrating sphere that was placed behind the quantum dot film. The LR quantum dot film sample was mounted on the port of an integrating sphere such that all the excitation from the source went through the film into the integrating sphere and was then collected.

TERMINOLOGY

Power conversion efficiency (%)=$P_{ph}/P_L$;
405 nm punch through (%)=$P_{Lpth}/P_L$;
$P_L$ is 405 nm excitation power; $P_{ph}$ is power of phosphor emission; $P_{Lpth}$ is power of punch through
QE: quantum efficiency, as measured using an Ocean Optics integrating sphere and USB 2000+ spectrometer.

Data was collected using Ocean Optics USB 2000+ spectrometer and is provided in Table 2.

TABLE 2

| Example | Sample | Power (350-470 nm) | Power (550-700 nm) |
|---|---|---|---|
| 2-1 | No film | 4318 uW | 21 uW |
| 2-3 | S-1 | 173 uW | 537 uW |
| 2-4 | No film | 5507 uW | 28 uW |
| 2-5 | S-2 | 371 uW | 780 uW |

TABLE 3

| Example | Sample | Punch Thru | QE | Power Conversion Efficiency |
|---|---|---|---|---|
| 3-1 | S-1 | 6.3% | 45% | 16% |
| 3-2 | S-2 | 4.0% | 45% | 13% |

In Table 3, 6.3% punch thru means that 93.7% source photons are absorbed by the quantum dot film while a 4% punch through means that 96% of the source photons are absorbed by the film. These examples clearly show how an LR quantum dot film can be used to absorb substantially all of the excitation from source LED chips and control fully the emission output from the device.

Example 4

Modeling Light Absorption, Emission, and Reabsorption

General Procedure

Representative optical density $D(\lambda)$ spectra, emission $E(\lambda)$ spectra, and emission quantum yields (QY) for LR quantum dots and conventional quantum dots were determined experimentally. The power spectrum of a typical 450-nm diode was converted to photons via the relationship: $Io(\lambda)=0.5035\times 1016*P(\lambda)*\lambda$. Quantum dot emission spectra were normalized according to the equation: $Etotal=\int(\lambda)d\lambda$ and $Eo(\lambda)=E(\lambda)/Etotal$. Absorbed photons were calculated from the equation: $T(1)=10-D(\lambda)$, $A(\lambda)=1-T$, and $IA(\lambda)=Io(\lambda)*A(\lambda)$. The total number of absorbed photons is given by: $IAtotal=\int IA(\lambda)d\lambda$. The initial emission spectrum resulting from the LED exposure is then given by the equation: $E(\lambda)initial=IAtotal*QY*Eo(\lambda)$. However, a portion of this emission is re-absorbed by the dots according to: $E(\lambda)reabs1=E(\lambda)initial*A(\lambda)$. The 'net' emission is given by: $E(\lambda)net1=E(\lambda)initial-E(\lambda)reabs1$. However this relationship overestimates re-absorption because a portion of $E(\lambda)net1$ that is reabsorbed is successively re-emitted again. The true total emission is given by: $E(1)tot1=E(1)net1+E(1)reemit1$. The 'effective' quantum yield after this cycle of emission, re-absorption, and re-emission is then given by: $QY1=\int E(1)tot1d1/\int IA(1)d1$. The cycle of re-absorption and re-emission can be calculated on a repeated basis, but only by calculating re-absorption based on the just prior (not earlier) emission value. In each cycle the re-emission minus the following re-absorption is added to the accruing total emission value. In this way the total emission converges on a final value. This convergence typically occurs after 3 or 4 cycles of re-absorption and re-emission. A final effective quantum yield and a final corrected emission spectrum (and, by difference from the original emission spectrum, a total self-absorption spectrum) can then be determined. The calculations do not incorporate corrections for attenuation of either exciting or emitted light through the sample, which are geometry-dependent factors. However, by keeping the conditions for the different quantum dot materials similar (e.g., the optical density at the LED wavelength) and the fact that the emission bands have similar shape, then these effects will not significantly affect the relative results.

Figure 7:
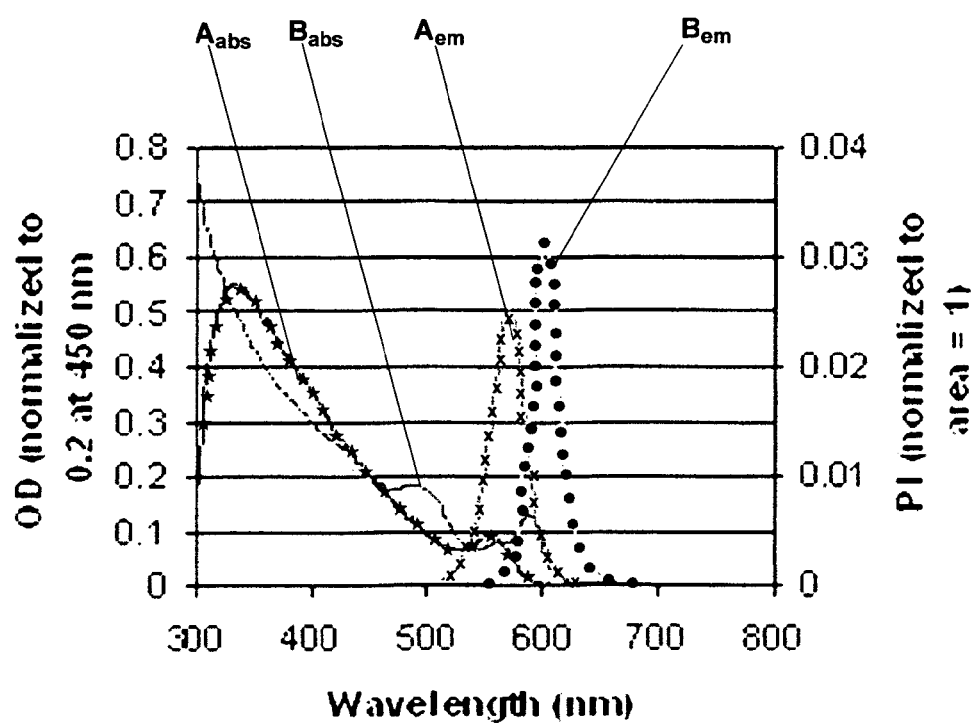
FIG. 7 shows the absorption and emission spectra for certain conventional quantum dots.

Conventional quantum dots, referred to as QD-A and QD-B were synthesized by well-known methods ("Control of Photoluminescence Properties of CDSE Nanocrystals in Growth", Qu L., Peng X., Journal of the American Chemical Society, 2002, Vol. 124, 2049) and their spectra data are shown in FIG. 7. Plotted are the optical density (OD) vs. wavelength for absorption, and photoluminescence (PL) vs. wavelength for emission. Curve $A_{em}$ and $B_{em}$ show the emission spectra of Components A and B; which have emission maxima in the green at 568 nm and in the red at 602 nm respectively. Curve $A_{abs}$ and $B_{abs}$ show the corresponding absorption spectra.

Figure 8:
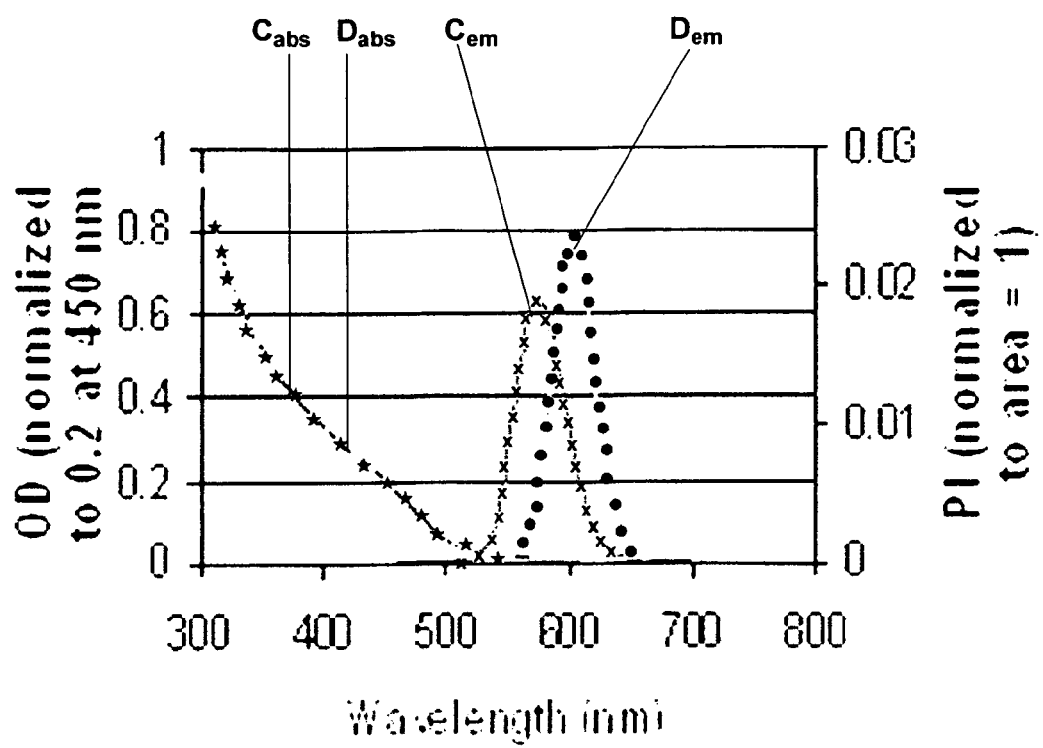
FIG. 8 shows the absorption and emission spectra for certain LR quantum dots.

Low reabsorption quantum dots (LR quantum dots), referred to as LRQD-D and LRQD-E, were also synthesized and their spectra data are shown in FIG. 8. Curve $D_{em}$ and $E_{em}$ show the emission spectra of D and E; which have green and red emission maxima at 572 nm and 602 nm respectively. Curve $D_{abs}$ and $E_{abs}$ show the corresponding absorption spectra.

In order to model light absorption, reabsorption, and emission, the absorption curves listed above were adjusted so that initially each component quantum dot had an OD of 0.2 at 450 nm. The PL curves were normalized to an area of 1. Modeling assumed excitation with a 1-Watt LED that emits at 450 nm. The quantum dots were modeled individually and also in combination as a mixture of two emitting materials. For modeling purposes, each quantum dot was assumed to have an intrinsic quantum yield of 0.50. The intrinsic quantum yield does not correct for any reabsorption of emitted light. The effect of reabsorption was modeled as described above and an "effective quantum yield" (E-QY) was determined; this approximates the quantum yield that one would expect to obtain in a practical device. The optical density of each quantum dot at 450 nm was varied from 0.2 to 0.8. Table 4 and Table 5 provide the modeling results for the conventional quantum dots and LR quantum dots respectively.

TABLE 4

Conventional Quantum Dots

| | OD at 450 nm | | | Elective Quantum Yield (E- QY) | | |
|---|---|---|---|---|---|---|
| Example | QD-A | QD-B | Mixture (A + B) | QD-A | QD-B | Mixture (A + B) |
| 4-1 | 0.2 | 0.2 | 0.4 | 0.46 | 0.42 | 0.44 |
| 4-2 | 0.4 | 0.4 | 0.8 | 0.43 | 0.33 | 0.38 |
| 4-3 | 0.8 | 0.8 | 1.6 | 0.38 | 0.20 | 0.29 |

TABLE 5

LR Quantum Dots

| | OD at 450 nm | | | Effective Quantum Yield (E- QY) | | |
|---|---|---|---|---|---|---|
| Example | LRQD-C | LRQD-D | Mixture (C + D)) | LRQD-C | LRQD-D | Mixture (C + D) |
| 5-1 | 0.2 | 0.2 | 0.4 | 0.49 | 0.49 | 0.49 |
| 5-2 | 0.4 | 0.4 | 0.8 | 0.48 | 0.48 | 0.48 |
| 5-3 | 0.8 | 0.8 | 1.6 | 0.46 | 0.47 | 0.46 |

As can be seen by comparing Tables 4 and 5, a mixture of green and red light-emitting LR quantum dots (Examples 5-1 through 5-3) show a significantly greater effective quantum yield than the corresponding conventional quantum dots (Examples 4-1 through 4-3). This corresponds to an increase in effective quantum yield of 10 to 60%.

Example 5

White Light-Emitting Device

A light source (LED chip) having an emission wavelength of 455 nm was die attached to a regular silver coated Cu substrate. Wire bonding using gold wires 0.032 mm (1.25 mil) in diameter was employed to make the electrical connection between the electrodes of the light source and the substrate. A silicate phosphor (Internatix G2762, having a particle size of about 15 microns) with an emission wavelength of 525 nm was mixed with Dow Corning silicone kit using a ratio of phosphor:part A:part B of 0.9:0.8:1.6 by weight. The mixture was coated on top of the LED light source and then cured at 150° C. for one hour. LR quantum dots having an emission maximum at a wavelength of 609 nm were mixed with polymer (1 g of mercapto functionalized ester, which is a clear, colorless, liquid photopolymer that will cure when exposed to ultraviolet light) and the mixture was dispensed on top of a round shaped polycarbonate lens and then exposed to UV light and cured for 50 min. The lens was then attached to the device such that it was spaced 5 mm apart from the LED and a reflector cup was added. FIG. 4 shows a schematic representation of the device (except in this example only one LED chip was used).

Figure 9:
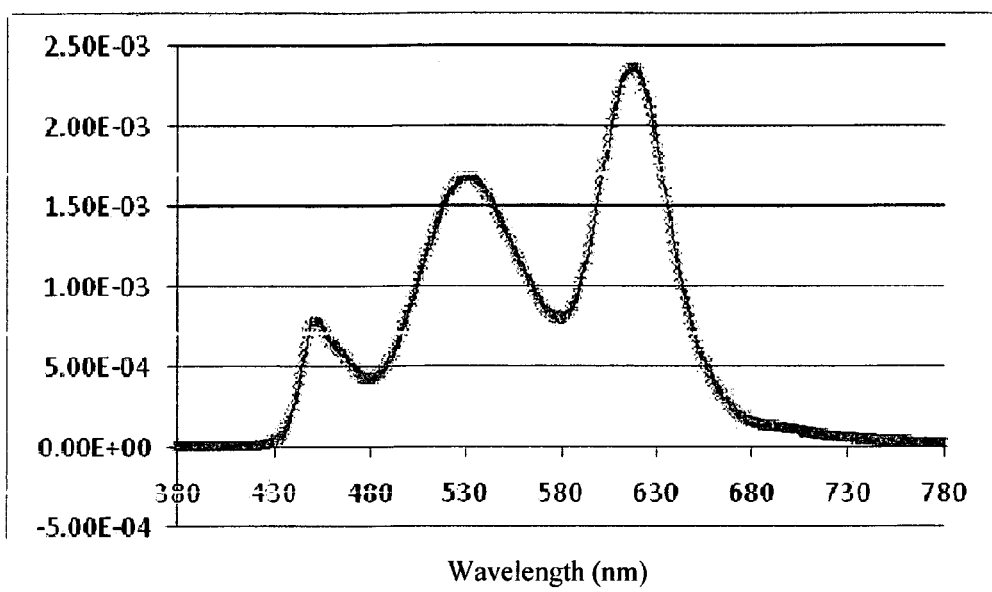
FIG. 9 shows the emission spectrum of a white light-emitting device.

An integration sphere was used to measure the correlated color temperature (CCT), color rendering index (CRI), light output, and chromaticity point of the above device when it was operated. Light from the device had a CRI of 91 and a light output of 95 lm at a CCT of 3642° K. The emission spectrum (emission intensity vs. wavelength) is shown in FIG. 9. It is clear from this example that the combination of a blue light-emitting LED, green light-emitting phosphor particles, and red light-emitting LR quantum dots can provide white light having excellent color rendering properties.

The invention has been described in detail with particular reference to certain preferred embodiments thereof, but it will be understood that variations and modifications can be effected within the spirit and scope of the invention.

The invention claimed is:
1. A light-emitting device comprising:
 a) a light source that emits a first light having an emission maximum in a first wavelength range from 300 nm to 500 nm;
 b) a first light-emitting material comprising undoped low reabsorbing semiconductor nanocrystals, and spaced apart from the light source and optically coupled to receive at least a portion of the first light from the light source, wherein the first light-emitting material absorbs a first fraction of the first light and emits a second light having lower energy than the first light and having an emission maximum in a second wavelength range, wherein the first light-emitting material comprises undoped low reabsorbing semiconductor nanocrystals that include an emission-center core, an exterior protective shell, and at least one inner light-absorbing shell between the emission-center core and the exterior protective shell, wherein the inner light-absorbing shell is capable of absorbing light in the first wavelength range, the emission-center core is capable of emitting light in the second wavelength range, wherein the at least one inner light-absorbing shell between the emission-center core and the exterior protective shell comprises at least three monolayers, wherein the absorption zone of the light-absorbing shell is from 5 to 500 times in volume of the emission zone of the emission-center core, and wherein the undoped low reabsorbing semiconductor nanocrystals have reduced self-quenching of the emission to less than 10%;
 c) at least a second light-emitting material optically coupled to receive at least a portion of the first light from the light source, and wherein the second light-emitting material absorbs a second fraction of the first light and emits a third light having lower energy than the first light and having an emission maximum in a third wavelength range.

2. The light-emitting device of claim 1 wherein the light source comprises at least one light-emitting diode.

3. The light-emitting device of claim 1 wherein the second wavelength range is from 600 nm to 700 nm, and the third wavelength range is from 500 nm to 600 nm.

4. The light-emitting device of claim 1 wherein the first wavelength range is from 440 nm to 490 nm, the second wavelength range is from 600 nm to 640 nm, and the third wavelength range is from 530 nm to 580 nm.

5. The light-emitting device of claim 1 including an optical element spaced apart from the light source and optically coupled to receive at least a portion of the light from the light source, and wherein the optical element comprises the first light-emitting material.

6. The light-emitting device of claim 1 wherein the first and second light-emitting materials are mixed together and contained in a layer.

7. The light-emitting device of claim 1 wherein the first and second light-emitting materials are contained in layers and the layers are separate from each other.

8. The light-emitting device of claim 7 wherein the layer containing the second light-emitting materials is located between the layer containing the first light-emitting material and the light source.

9. The light-emitting device of claim 7 wherein the second light-emitting material is contained in a layer that is adjacent to the light source.

10. The light-emitting device of claim 1 wherein the average absorbance ratio of the low reabsorbing semiconductor nanocrystals is 8 or greater and, simultaneously, the emission quantum yield is greater than or equal to 50%.

11. The light-emitting device of claim 1 wherein the emission-center core comprises at least one member selected from the group consisting of ZnSe, CdSe, InP, $CdSe_xS_{(1-x)}$, $Cd_xZn_{(1-x)}Se$, $(InP)_xZnSe_{(1-x)}$, and combinations thereof, wherein x has a value of 0 to 1.

12. The light-emitting device of claim 1 wherein the emission-center core comprises $CdSe_xSi_{1-x}$, wherein x has a value of 0 to 1.

13. The light-emitting device of claim 1 wherein the at least one inner light-absorbing shell is selected from the group consisting of ZnSe, CdS, $Cd_xZn_{(1-x)}S$, $ZnSe_xS_{(1-x)}$, and combinations thereof, wherein x has a value of 0 to 1.

14. The light-emitting device of claim 1 wherein the at least one inner light-absorbing shell comprises $Cd_xZn_{(1-x)}S$, wherein x has a value of 0 to 1.

15. The light-emitting device of claim 1 wherein the exterior protective shell is selected from the group consisting of ZnS, ZnO, and combinations thereof.

16. The light-emitting device of claim 1 wherein the exterior protective shell comprises ZnS.

17. The light-emitting device of claim 1 wherein the second light-emitting material comprises a phosphor material.

18. The light-emitting device of claim 17 wherein the phosphor material comprises silicate-based phosphors or garnet-based phosphors.

19. The light-emitting device of claim 17 wherein the phosphor material comprises YAG phosphor.

20. The light-emitting device of claim 1 wherein the second light-emitting material comprises a second set of low reabsorbing semiconductor nanocrystals that include an emission-center core, an exterior protective shell, and at least one inner light-absorbing shell, and wherein the inner light-absorbing shell is capable of absorbing light in the first wavelength range, and the emission-center core is capable of emitting light in the third wavelength range.

21. The light-emitting device of claim 20 wherein the emission-center core comprises low reabsorbing semiconductor nanocrystals that emit green light in the range of 540 nm to 560 nm.

22. The light-emitting device of claim 1 wherein light emitted from the device is combined to produce white light having a color rendering index greater than 80.

23. The light-emitting device of claim 1 wherein light emitted from the device is combined to produce white light having a color rendering index greater than 90.

24. A method of producing white light having a color rendering index greater than 80 using the device of claim 1, the method comprising:
    a) using the light source to generate a first light having an emission maximum in a wavelength range that is from 440 nm to 490 nm;
    b) irradiating the first light-emitting material with at least a portion of the first light such that a first fraction of the first light is absorbed by the first light-emitting material, and wherein the first light-emitting material emits a second light having an emission maximum in a wavelength range that is from 600 nm to 640 nm;
    c) irradiating the second light-emitting material with the first light such that a second fraction of the first light is absorbed by the second light emitting material, and wherein the second light-emitting material emits a third light having an emission maximum in a third wavelength range that is from 530 nm to 580 nm; and
    d) combining the first light, the second light, and the third light to afford white light having a color rendering index greater than 80.

25. The light-emitting device of claim 1 wherein the ratio of the volume of the inner light-absorbing shell to the emission-center core is 10 or greater.

26. A device comprising undoped low reabsorbing semiconductor nanocrystals, wherein the undoped low reabsorbing semiconductor nanocrystals include an emission-center core, an exterior protective shell, and at least one inner light-absorbing shell between the emission-center core and the exterior protective shell, wherein the inner light-absorbing shell is capable of absorbing light in a first wavelength range, the emission-center core is capable of emitting light in a second wavelength range, wherein the at least one inner light-absorbing shell between the emission-center core and the exterior protective shell comprises at least three monolayers, wherein the absorption zone of the light-absorbing shell is from 5 to 500 times in volume of the emission zone of the emission-center core, and the undoped low reabsorbing semiconductor nanocrystals have reduced self-quenching of the emission to less than 10%, and also including one or more phosphor materials or one or more types of conventional quantum dots or combinations thereof.

27. The device of claim 26 wherein the low reabsorbing semiconductor nanocrystals are capable of emitting light having an emission maximum in the range of 600 nm to 700 nm.

28. The device of claim 26 wherein the phosphor materials are capable of emitting light having an emission maximum in the range of 500 nm to 600 nm.

29. An optical element comprising a substrate and including undoped low reabsorbing semiconductor nanocrystals, wherein the undoped low reabsorbing semiconductor nanocrystals include an emission-center core, an exterior protective shell, and at least one inner light-absorbing shell between the emission-center core and the exterior protective shell, wherein the inner light-absorbing shell is capable of absorbing light in a first wavelength range, and the emission-center core is capable of emitting light in a second wavelength range, wherein the at least one inner light-absorbing shell between the emission-center core and the exterior protective shell comprises at least three monolayers, wherein the absorption zone of the light-absorbing shell is from 5 to 500 times in volume of the emission zone of the emission-center core, and wherein the undoped low reabsorbing semiconductor nanocrystals have reduced self-quenching of the emission to less than 10%.

30. The optical element of claim 29 wherein the substrate comprises transparent glass or plastic.

31. The optical element of claim 29 wherein the substrate comprises light scatterers.

32. The optical element of claim 29 wherein the low reabsorbing semiconductor nanocrystals are coated on an exterior surface of the substrate.

33. The optical element of claim 29 wherein the low reabsorbing semiconductor nanocrystals are contained within the substrate.

34. The optical element of claim 29 further including phosphor materials.

* * * * *